United States Patent [19]

Fielder

[11] Patent Number: 5,845,240
[45] Date of Patent: Dec. 1, 1998

[54] SELECTIVE RECALL AND PRESERVATION OF CONTINUOUSLY RECORDED DATA

[76] Inventor: Mark Fielder, 160 Bleecker St., New York, N.Y. 10012

[21] Appl. No.: 687,151

[22] Filed: Jul. 24, 1996

Related U.S. Application Data

[60] Provisional application No. 60/001,402 Jul. 24, 1995.

[51] Int. Cl.[6] ............................................ G10L 3/00
[52] U.S. Cl. .......................... 704/201; 360/53; 360/48; 369/32; 369/54; 369/47; 369/58; 369/61; 369/72.2
[58] Field of Search ............................... 395/2.1; 704/201; 360/53, 48; 369/32, 54, 47, 58, 61, 72.2

[56] References Cited

U.S. PATENT DOCUMENTS

| | | |
|---|---|---|
| 4,331,837 | 5/1982 | Soumagne ........................ 395/2.42 |
| 5,053,896 | 10/1991 | Sakata et al. ........................ 360/71 |
| 5,371,551 | 12/1994 | Logan et al. . |
| 5,379,153 | 1/1995 | Ishii et al. ........................ 360/27 |
| 5,386,493 | 1/1995 | Degen et al. ........................ 395/2.76 |
| 5,431,691 | 7/1995 | Snell et al. . |
| 5,465,120 | 11/1995 | Schultheiss . |
| 5,477,487 | 12/1995 | Greenberg . |
| 5,487,754 | 1/1996 | Snell et al. . |
| 5,487,755 | 1/1996 | Snell et al. . |
| 5,592,586 | 1/1997 | Maitra et al. ........................ 395/2.29 |
| 5,617,383 | 4/1997 | Matsumoto et al. ........................ 369/32 |

*Primary Examiner*—David R. Hudspeth
*Assistant Examiner*—Vijay B. Chawan
*Attorney, Agent, or Firm*—Friedman Siegelbaum LLP

[57] ABSTRACT

A recording method and apparatus enabling a user to select for recall and preservation portions of audio, video or other data that have been continuously recorded on a finite extent of recording medium, thereby enabling the effective recording and reproduction of events that transpired before the decision to record or reproduce them was made.

28 Claims, 10 Drawing Sheets

SELECTIVE RECALL AND PRESERVATION OF CONTINUOUSLY RECORDED DATA

This invention is covered by Disclosure Document No. 359216, filed with the U.S. Patent & Trademark Office on Aug. 8, 1994, and by Provisional patent application Ser. No. 60/001,402, filed with the U.S. Patent & Trademark Office on Jul. 24, 1995.

FIELD OF THE INVENTION

This invention relates to the mechanical, electrical, magnetic or other mechanized recording and reproduction of auditory and/or visual or other data, and particularly to an improved process of recording which enables human users to decide whether to preserve a record of events that have already transpired.

BACKGROUND OF THE INVENTION

Current methods of mechanized recording have a significant deficiency, so basic that it is rarely if ever considered: In order to record any event, a human user must decide to record it prior to the event taking place. Thus, with the exception of continuous monitoring systems (discussed below), recording is generally limited to explicit dictation of words or staging of events.

Accordingly, there is a need for a recording method that effectively allows a user to decide to record an event after the event has taken place. One way to achieve this is by continuously recording all ambient events in a continuous logical loop on a finite extent of recording medium, allowing users to select for permanent preservation portions of the material thus recorded, before they are overwritten with new material. Although this method has not heretofore been devised, prior art for some of its components does exist in a number of forms:

(1) Tape formats, including cartridges and cassettes, that record on a continuous loop of recording medium. These have been used only to record a single sequence of material, not extending beyond the length of the medium itself. The loop format serves merely to eliminate the need for rewinding the tape when repeatedly playing it.

(2) Devices such as the flight data recorder or "black box" used in aviation. This type of device does record events in a continues loop, overwriting the material earliest recorded with fresh material so that, by recording continuously, the medium always contains the most recently recorded material. However, the data stored in these devices are inspected only on special occasions (such as a crash), and no means of selecting material for permanent preservation is provided.

(3) Systems used for telephone monitoring which produce a continuous record. These generally record automatically, and only when a telephone is in use. Some of these allow recall of the most recent data recorded. Further, some of these systems use continuous-loop buffers so that mechanized processes may determine the suitability of recorded material for permanent storage. These systems preserve the entire record of continuously recorded material (subject only to mechanized determination of suitability), thereby requiring an indeterminate supply of recording medium.

(4) Recording systems that detect intervals of silence during recording and thereby conserve recording medium.

The foregoing prior art is substantially in the public domain. Various digital voice-message dictation, storage and editing systems are in the patent literature:

U.S. Pat. No. 4,627,001 (Stapleford et al., 1986) discloses a "dictation and editing system including microphone and keyboard inputs to a programmed computer system." This invention provides a visual display which shows a series of "voice token marks," representing speech or sound recorded by the microphone, interspersed with characters entered via the keyboard. Thus it enables a user to mark or annotate points in his or her voice dictation. The same basic ideas are amplified in the same inventors' U.S. Pat. No. 4,779,209 (1988).

U.S. Pat. No. 5,265.075 (Bergeron et al., 1993) discloses a "voice processing system with editable voice files," including a "central dictation system for prerecording standard voice files," and enabling users to make copies of and edit these prerecorded files.

U.S. Pat. No. 5,008,835 (Jachmann et al., 1991) discloses a voice mail system which enables users to interrupt playback of voice mail message to record replies.

U.S. Pat. No. 4,375,083 (Maxemchuk, 1983) discloses a method for editing previously recorded voice messages, which detects intervals of silence, separates the recording into segments at these intervals, and enables users to edit the recording by rearranging and/or deleting these segments.

By their own language, all of these inventions have to do explicitly with dictation, that is, with recording of speech or events as a result of a prior decision to record. Moreover, these systems all share significant drawbacks with recording methods in the public domain, such as preserving essentially the entire record of recorded material when operated continuously, thereby requiring an indeterminate supply of recording medium and requiring users to edit out any unwanted portions.

In conclusion, with respect to all of the prior art, the present invention has the advantage of enabling users to decide to record events on a finite supply of recording medium after those events have occurred, and the further advantage of reducing or eliminating the need to review continuously recorded material and discard any unwanted portions thereof.

SUMMARY OF THE INVENTION

The present invention differs from all previous recording methods in that it enables users effectively to record words that have already been spoken, or events that have already taken place, prior to the time that a user decides to record them. This is achieved by recording events on a finite extent of recording medium in a continuous logical loop (i.e., overwriting the earliest recorded data with new data whenever the end of the medium used for this continuous recording is reached), and playing back and/or permanently preserving (capturing) portions of the recorded data as selected by the user.

A further advantage of this invention is that it allows users to preserve the spontaneity of their speech and actions by dispelling the self-consciousness that sets in when people know that they are being recorded-which happens even when people record themselves, triggered by the very act of switching on a recording device. Moreover: Even in continuous monitoring methods, where continuous recording on an indeterminate supply of recording medium is practicable, there is the need to go back to search for and edit out the parts to be preserved, discarding the rest. The present invention goes far towards eliminating that need, by capturing data permanently only in response to a user's explicit request (although this request must come within a predetermined, finite period from the time of the event).

The present invention may be applied to sound or video recording, as well as recording the sequence of user actions (or other events) on a computer or other machine or on a musical instrument. The invention may be embodied, with varying degrees of practicality, using any rewritable recording medium, including electronic memory, tape, wire, or discs, both analog and digital. However, the current preferred medium for continuous recording is digital memory, as it entails a minimum of wear, power consumption and bulk-especially important in a portable device.

The essential components of this invention-beyond a minimum of appropriate hardware to detect, acquire and preserve data-are algorithms, which may be implemented as either hardware or software or both. The invention may be implemented as a program on a general-purpose computer, using either a single-thread or a multithreaded operating system, as long as means of acquiring and playing back data are provided.

Following is a description of an embodiment of this invention as a computer type program to capture audio data, running on an interrupt-driven computer of known type and using digital memory as the continuous recording medium. In particular, this scheme is designed to work with the waveform audio and multitasking capabilities of the Microsoft® Windows® family of operating systems, and to be programmed using the object-oriented Microsoft Foundation Classes. (The scheme of waveform buffer handling described below is provided by these tools.) The same scheme may be used in a dedicated device other than a general-purpose computer; and variations of this scheme may be used to record other streams of events, e.g., video data. In this last case, the division of the continuous recording into blocks separated by intervals of silence may be replaced by a separation into blocks each having the same base frame as detected by a video compression algorithm.

This embodiment uses, in place of a single circular acquisition buffer for storing continuously recorded data, a circular array of smaller, separately allocated buffers. This arrangement affords a number of advantages on the design as compared with a single, larger buffer: (1) On general purpose computers, smaller blocks of memory are easier to allocate and move than larger ones; (2) smaller-size numbers (e.g., 16 bits for a 64 KB buffer) may be used to keep track of locations in the smaller buffers; and (3) this arrangement allows a simplified scheme for keeping track of areas that have been overwritten with fresh data.

DETAILED DESCRIPTION OF THE PREFERRED EMBODIMENT

Figure 1:
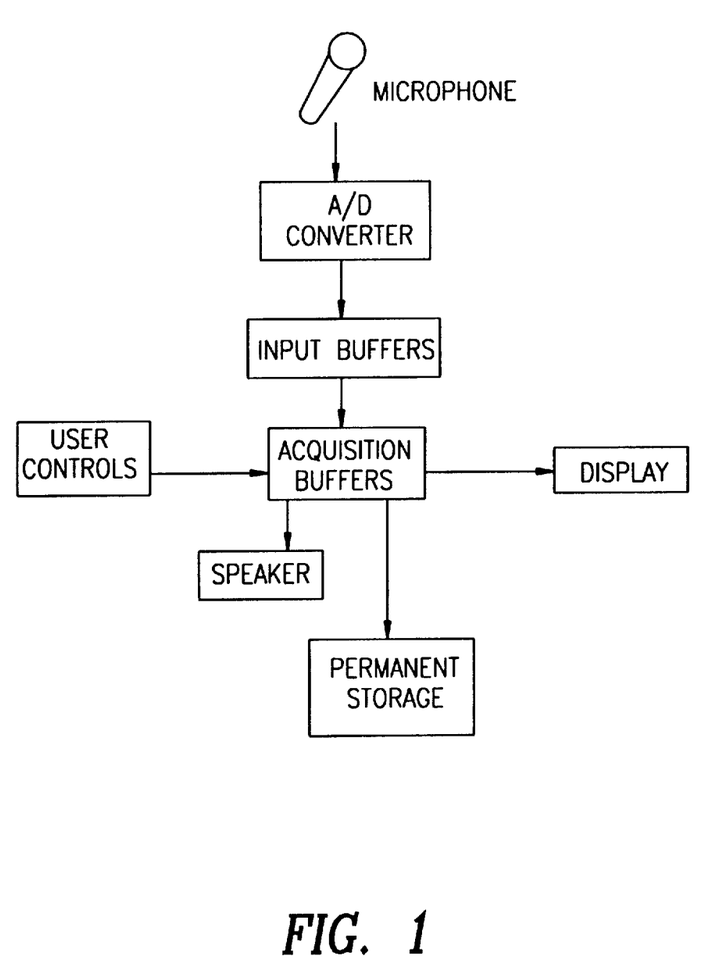
FIG. 1 shows an overall block diagram of the parts of the preferred embodiment and their interrelationships.

FIG. 1 shows the major components and their interrelationships: an analog input transducer such as a microphone feeding a continuous signal to an analog-digital converter, which in turn passes a train of digital sample values to a set of input buffers. From these the sample train is continuously supplied to a circular set of acquisition buffers. The contents of the acquisition buffers are shown on a periodically updated display, and parts of the contents of the acquisition buffers may, by means of user controls, be played back through an output transducer such as a speaker or selected for preservation in permanent storage.

Acquisition and Storage of Audio Data

Analog audio data are acquired through a microphone, telephone or similar transducer or input, converted into digital data at a certain sampling frequency by an analog-digital converter, and stored sequentially in a circular series of input buffers. In an arrangement typical of personal computers, a peripheral sound card incorporating an analog-digital converter acquires audio signals and stores them sequentially via direct memory access (DMA) in a queue of input buffers allocated by an application program. As each input buffer in turn becomes full, an interrupt signal or a message identifying the particular buffer is generated. When the application program receives this signal or message, the sound data are transferred from that input buffer to acquisition buffers in memory in the manner described in the following paragraphs. Concurrently with this transfer of data, audio data continue to be fed by the analog-digital converter into another input buffer or buffers, each of which in turn generates a further interrupt or message when it becomes full. After the contents of each buffer are transferred to the acquisition buffers, the input buffer is assigned to the tail end of the queue awaiting recording. A-minimum of two input buffers, used alternately, is required. Particularly in multitasking systems, there may be times when no input buffers are available for recording because all allocated input buffers are still awaiting transcription; when this occurs, new input buffers may be allocated. The memory allocated for these buffers may be freed when no longer needed, or when the number of unrecorded but allocated buffers exceeds a certain number.

Figure 2:
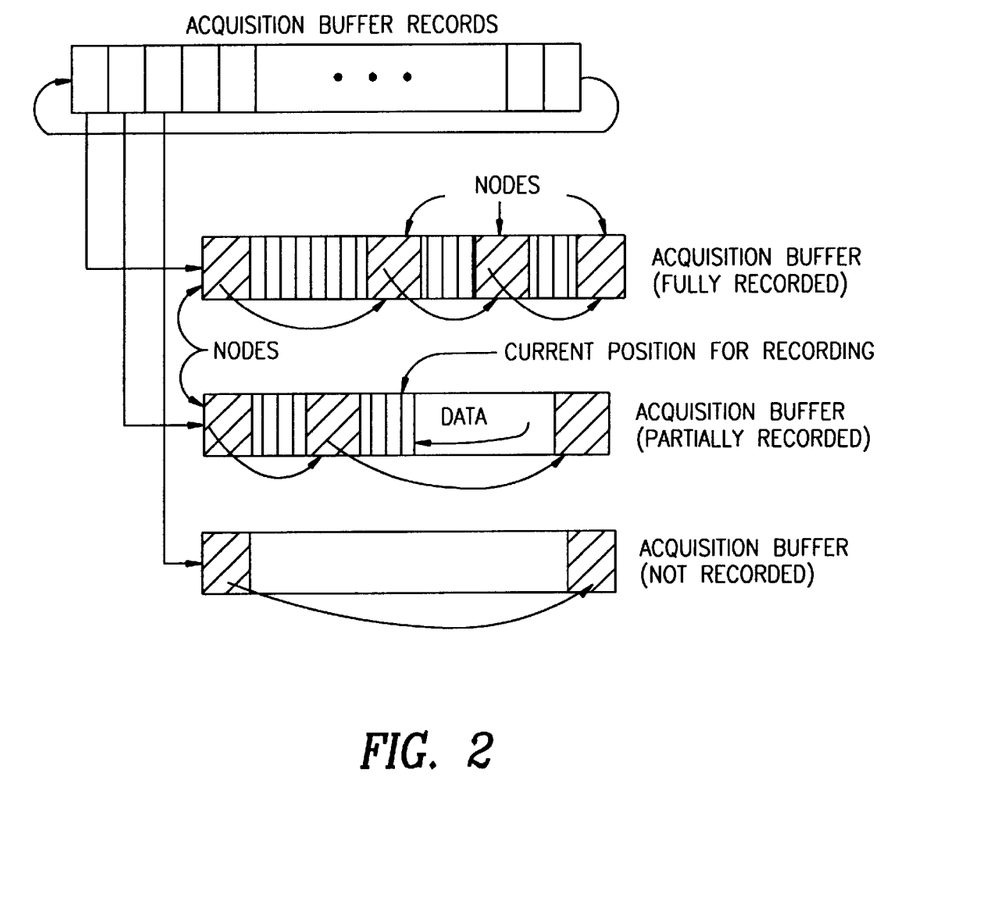
FIG. 2 shows the scheme for storing data in the acquisition buffers, using nodes to mark intervals of silence as well as the beginnings and ends of buffers. The array of acquisition buffer records is shown along with three representative acquisition buffers: one fully recorded, one partially recorded, and one not yet recorded.

An array of acquisition buffer records, illustrated in FIG. 2, provides access (for recording, playback and transfer to permanent storage) to the acquisition buffers and to the audio data stored in them. Each acquisition buffer record contains the following data:

| | |
|---|---|
| tTime | Number of sampling intervals elapsed, at the beginning of this buffer, since the beginning of the program run. In the record that terminates the array, this value is zero. |
| tEndTime | Number of sampling intervals elapsed, at the end of this buffer, since the beginning of the program run. |
| pWhere | Pointer to the acquisition buffer holding the audio data. In the record that terminates the array, this value is null. |

The various acquisition buffers each contain, in addition to audio data, at least two nodes, which mark the beginning and the end of each buffer. Additional nodes, interspersed in the audio data, are used to mark intervals of silence (as determined in the manner described below) within the buffer. The successive nodes within each acquisition buffer form a two-way linked list. Each node contains the following data:

| | |
|---|---|
| tDuration | Duration of silent interval, in sampling intervals. Zero for nodes marking the beginning or the end of a buffer. |
| nNext | Number of samples of sound data between the end of the current node and the location of the next node. |
| nPrev | Number of samples of sound data between the beginning of the current node and the end of the previous node. This facilitates reverse playback as well as searching backwards. |

FIG. 2 shows three acquisition buffers in various states of being recorded: Buffer 10 is completely filled, and has two silence nodes interspersed in the audio data; these forming a linked list with the beginning and end nodes of the buffer. Buffer 11 is partially filled with audio data, and its single silence node is similarly linked with the beginning and end node. Buffer 10 is empty of data, containing only the beginning and end nodes, which also form a linked list.

(In this acquisition buffer scheme, the data are held stationary in memory and accessed by moving cursors, as described below. An alternative dataflow arrangement is possible, in which data flow through a train of memory elements, all data elements moving to the next elements as each new sample is read in.)

Figure 4A:
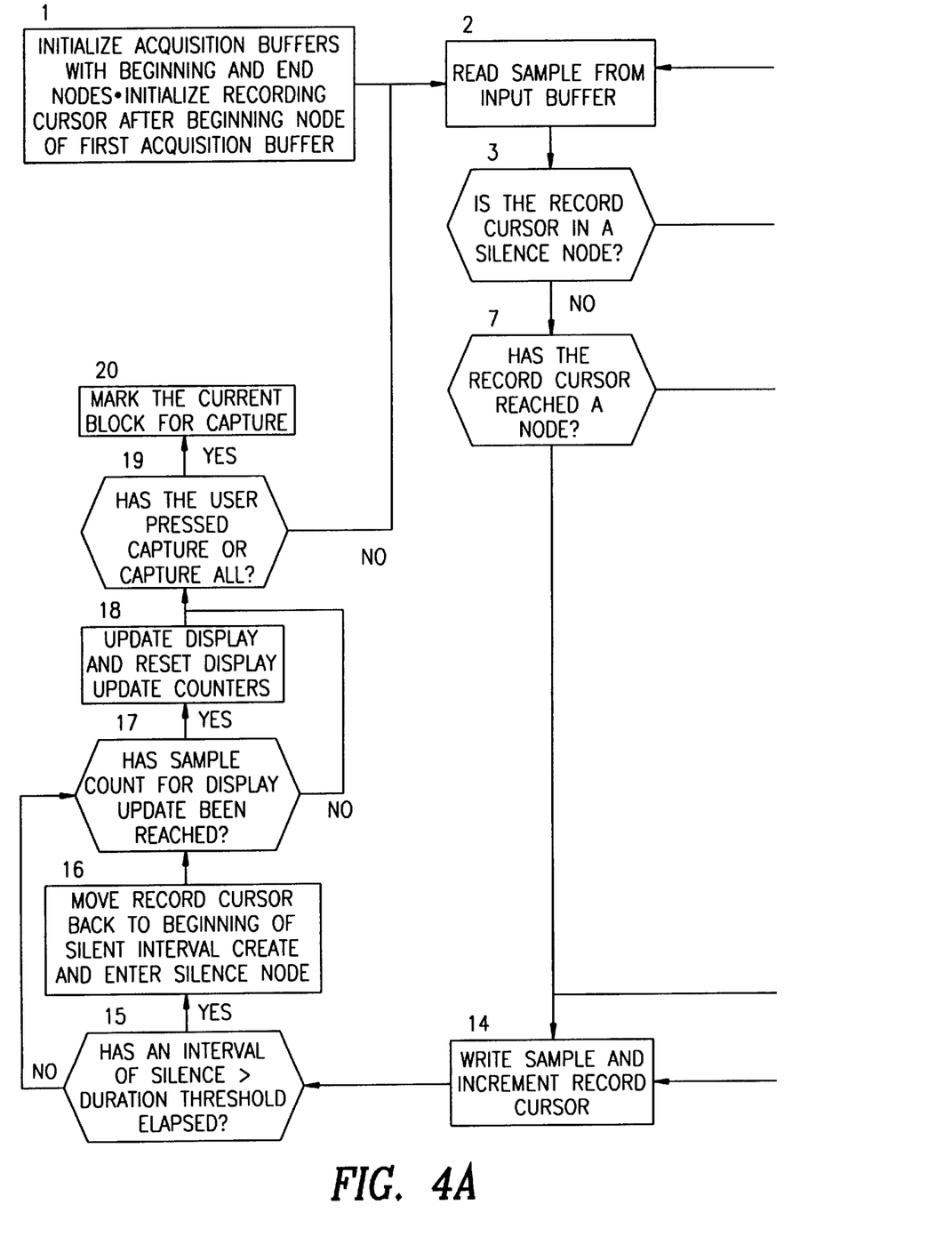
FIG. 4 is a flowchart of the continuous recording or acquisition process.
Figure 4B:
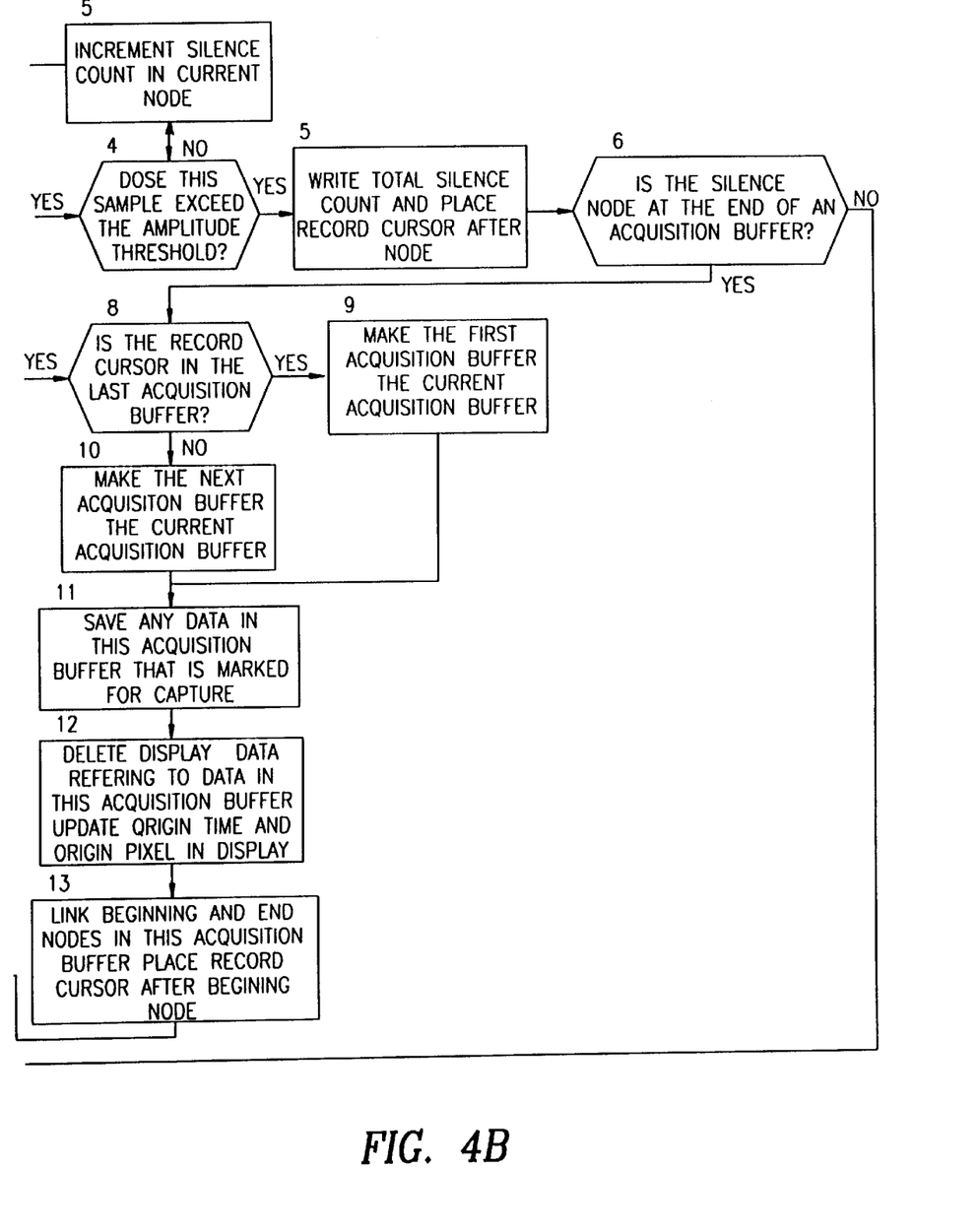

In the recording process illustrated in FIG. 4, the continuously acquired audio data are written successively to acquisition buffers, beginning with the acquisition buffer pointed to by the first record in the acquisition buffer table. When the recorded data reaches the end of that buffer (as indicated by reaching the node there, block 7), recording proceeds by writing to the acquisition buffer pointed to by the next record in the table. When the recording reaches the end of the acquisition buffer pointed to by the last acquisition buffer record, or the end of any other acquisition buffer except the last, recording proceeds with the acquisition buffer pointed to by the first record in the table, overwriting the existing contents of that acquisition buffer, (blocks 8–9).

On startup, each acquisition buffer is initialized with two nodes, one at the beginning of the buffer and one at the end. The nNext element of the beginning node points to the node at the end, and the nPrev element of the end node points to the beginning node (block 1; see also FIG. 2):

Any interval of audio data whose absolute amplitude values do not exceed a certain minimal level (the amplitude threshold) over a certain minimal duration (the duration threshold), and whose length exceeds that of a node, is treated as an interval of silence and is represented by a node in an acquisition buffer.

(This is a simple criterion for detecting an interval of silence; more sophisticated ones are possible, including those involving the detection and cancellation of ambient noise. Moreover, other signal-enhancement techniques, such as automatic gain control, may be incorporated in the continuous recording process.)

As audio data are transferred from the input buffers to the acquisition buffers, the successive amplitude values in the audio stream are measured against the amplitude and duration thresholds (FIG. 4, block 15), and the stream is accordingly stored in the acquisition buffers as segments of sound data interspersed with silence nodes. Whenever a new silence node is written in an acquisition buffer, its nPrev member is assigned the number of samples written between this node and the previous node, and the nNext member of the previous node is assigned the same value. Similarly, this node's nNext member is assigned the number of samples that may be written between this node and the node at the end of the acquisition buffer, and the end node's nPrev member is assigned the same value.

When a sufficient interval of silence has been detected, the recording cursor goes back to the beginning of the sequence of amplitude values in the acquisition buffers corresponding to this interval and writes a silence node there (blocks 15–16); this may involve going back into a previous acquisition buffer. Thus, if the data values at the end of an input buffer and those at the beginning of the next buffer fall within the threshold values for silence, or if the entire contents of successive buffers fall within the threshold values, a single node is generated with the total duration of the consecutive silent intervals.

If the beginning of a "silent" sequence is found to be within less than a node's length before the end node of the relevant acquisition buffer, the remaining spaces are filled in with actual amplitude values and the beginning node of the next acquisition buffer is used to mark the interval of "silence"; its duration is set to the remaining duration in the "silent" sequence.

In the foregoing discussion, references to "next" and "previous" acquisition buffers should be understood in light of the following: When the recording of incoming audio data reaches the end of an acquisition buffer, it resumes at the position following the beginning node of the acquisition buffer pointed to by the next acquisition buffer table element, except if the present acquisition buffer table element is the last element in the table. In that case, the "next" acquisition buffer is that pointed to b the element at the beginning of the acquisition buffer table. Likewise, the acquisition buffer table element "previous" to that at the beginning of the table is that at the end of the table. In this way, recording of amplitude data proceeds in a circular fashion, overwriting the oldest data with fresh data.

Whenever a previously recorded acquisition buffer is about to be overwritten with fresh data, the block record is checked to see if any of the buffer's contents have been selected for capture. If so, the selected data are written or appended to a file on the computer's hard disk (block 11). This file may be in a standard sound wave file format, suitable for playing through a standard media player program. Also, at this time, the origin time (whose value is the earliest time stored in the acquisition buffers) is updated to equal the start time of the next acquisition buffer record (block 12). Thus; the contents of any acquisition buffer in the process of being overwritten are unavailable for recall or storage.

In general, captured data may be preserved by writing it to any permanent storage medium, such as a disk, tape or (non-volatile) solid-state memory. Captured data may be preserved at any time between the decision to capture and the time that the data is overwritten; however, deferring storage until the acquisition buffer is about to be overwritten facilitates giving the user the ability to cancel the decision to capture a block of data.

When the system is to be shut down for any reason (as, for example, a critically low battery level), all captured data in the acquisition buffers are preserved prior to shutdown.

The capture interval, i.e., the time interval that may be captured before the user's decision to record, is a function of the quantity of recording medium and the recording density (i.e., length of recording time stored in a given quantity of recording medium). If captured data, rather than being transferred out of the acquisition buffer, are stored in a newly reserved area of the acquisition buffer, then the capture interval will diminish as this area becomes filled with captured data. Compression algorithms may be employed concurrently with recording the sound (as with the silence-node scheme described above), and/or on captured data in permanent storage, in order to maximize both the capture interval and the total recording time capacity of the device. In addition to data compression, captured data may be further processed for quality or compactness, for example via phonetic transcription or any signal-enhancing postprocessing method. (Within practical limits, these techniques may be used on the continuously recorded data as well.)

User Interface

Figure 3:
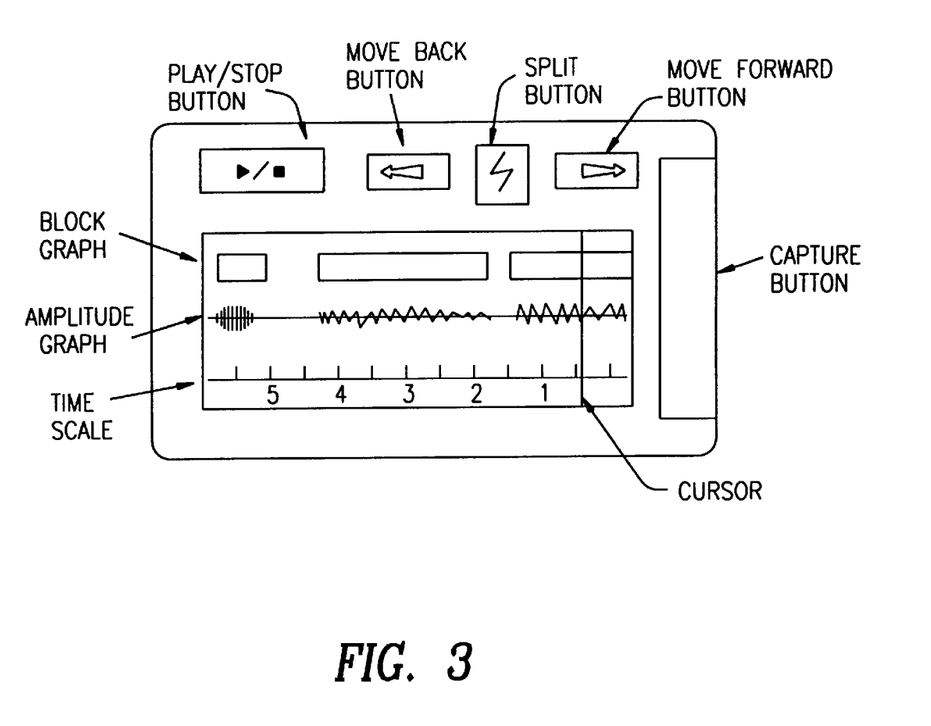
FIG. 3 shows the user interface, comprising the display and user controls, which may be embodied in a hand-held device or in a computer program.

The user is provided with a display representing audio data currently in the acquisition buffers, as well as controls to allow the user to recall (play back) data and to mark data for capture or permanent storage. All of these are shown in FIG. 3.

The display consists of three parts:

(1) A horizontal time scale marked in minutes and/or seconds, representing the positions in time relative to the current time of data in the acquisition buffers. (Alternatively, this scale may be marked with absolute time-of-day markings.)

(2) Parallel to the time scale, the amplitude graph, representing a series of numeric values, each of which is the maximum (or the average or some other relevant) amplitude value over its corresponding time interval. The amplitude graph may be a bar graph, a series of one-pixel-wide vertical lines whose heights correspond to the successive values in the amplitude record; or it may be a density graph, a series of vertical lines each drawn where the sum of successive amplitude record values reaches a fixed value.

(3) Parallel to the time scale and the amplitude graph, the block graph, representing the division of the contents of the acquisition buffers into blocks for selection and capture by the user. The displayed block graph represents the contents of the acquisition buffers divided into blocks separated by intervals of silence that exceed a minimum duration (the block separation threshold). The minimum duration of a block is identical to the duration threshold discussed under "Acquisition and Storage of Audio Data." Uncaptured blocks are shown as hollow rectangles on the block graph; captured blocks are shown as solid rectangles; and intervals of silence are shown as blank spaces between the displayed blocks.

A speaker, earphone or similar transducer or line output is provided for the purpose of playing back data in the acquisition buffers.

A cursor is provided, in the form of a vertical line intersecting or abutting the time scale, the block graph and the amplitude graph, to indicate (while in playback mode) the position on the display corresponding to the data being (or about to be) played back.

A function (the display update function) is called from time to time in the course of continuous recording, to update the display and its underlying data; this function is flowcharted in FIG. 5 and described in detail below.

The three parallel parts of the display represent, at any given time, the entire contents of the acquisition buffers (less any acquisition buffer currently being overwritten). As the physical space given to the display may be insufficient to represent these contents, the display may be provided with a means of scrolling its view to show the data for all times between the earliest time stored (the origin time) and the current time. Additionally, intervals of silence that exceed a certain length (the minimum ellipsis length) may be represented in all three display parts as the minimum ellipsis length, with a mark to show a "break" in the display.

Controls and Operation

Figure 7:
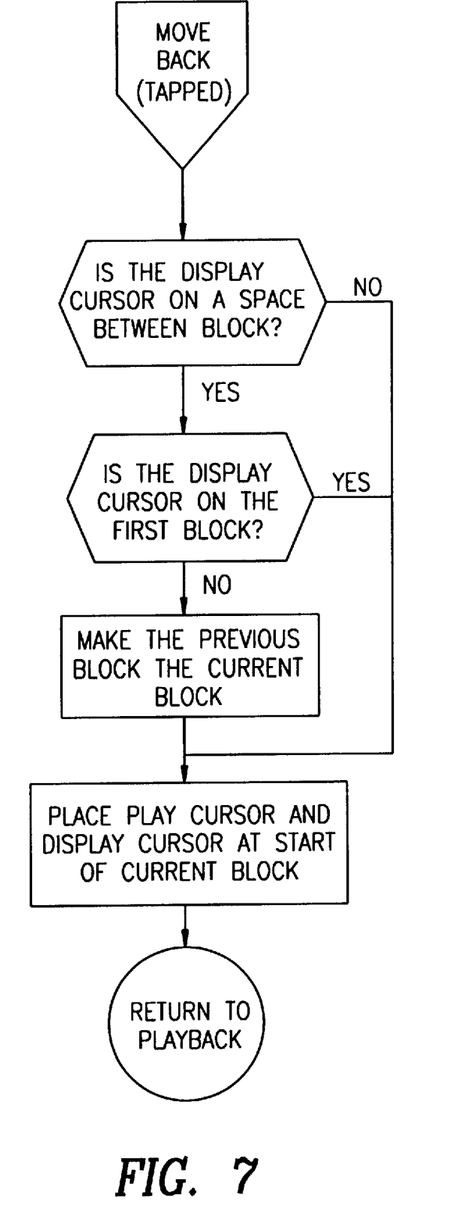
FIGS. 7–10 shows four flowcharts, detailing actions taken in response to various user controls.
Figure 8:
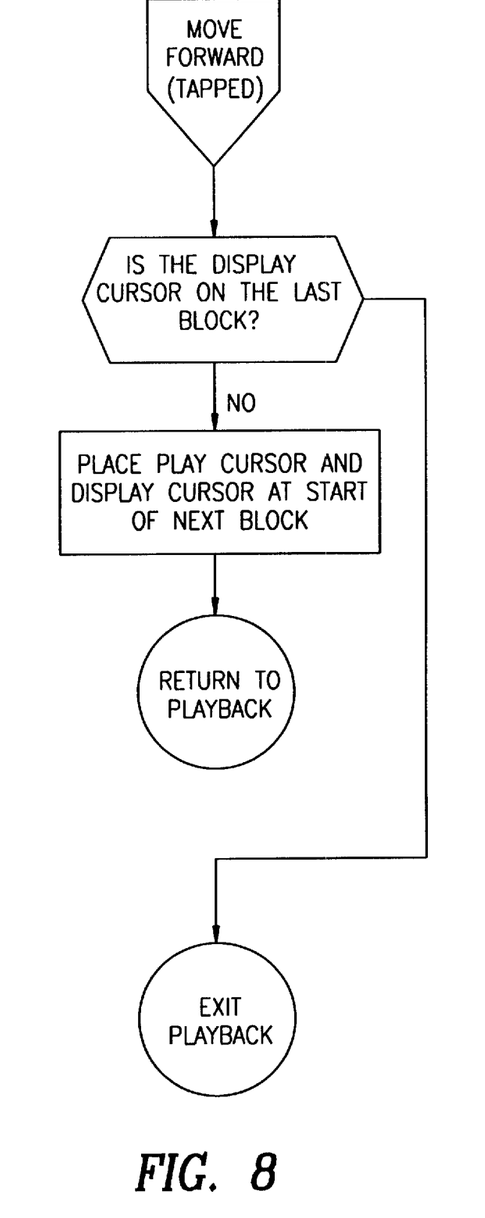
Figure 9:
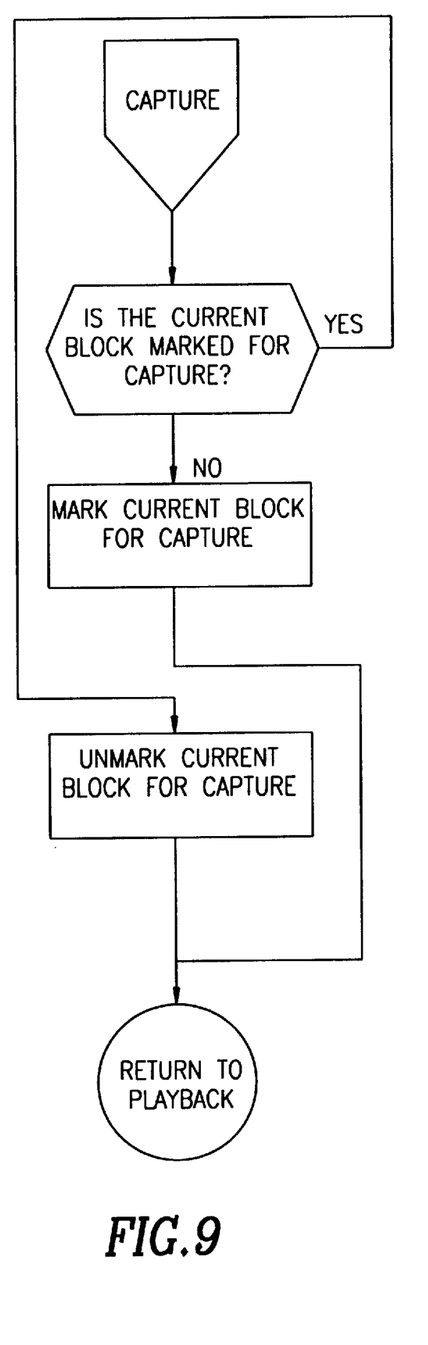
Figure 10:
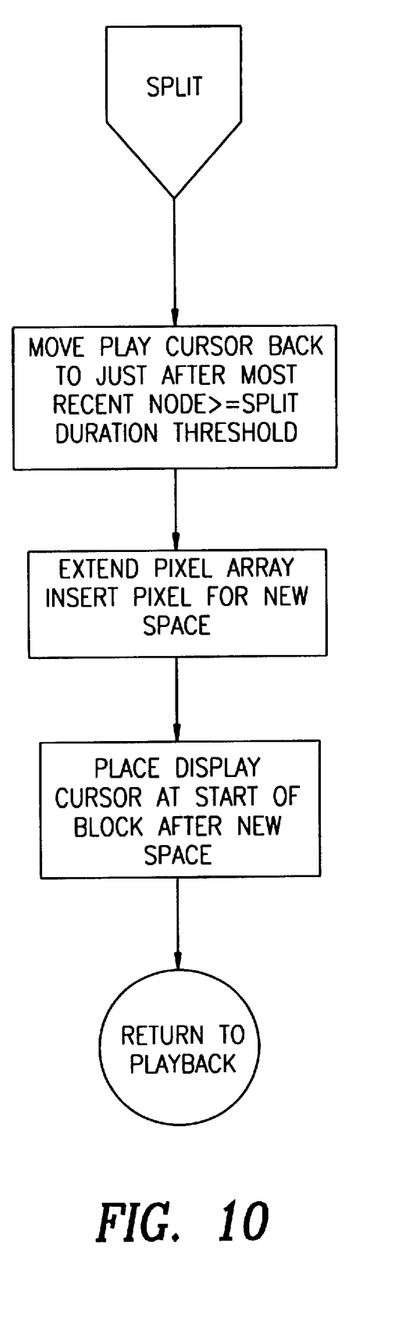

Controls (buttons) are provided for manipulating the cursor, playing back portions of recorded blocks, and capturing blocks:

| | |
|---|---|
| Move Back (FIG. 7) | If held and released quickly: Moves the cursor to the beginning of the current block. If at the beginning of a block, moves to the beginning of the previous block. If not in default mode, the cursor appears at the beginning of the most recent block. If held down: Moves the cursor continuously backward within the current block and previous blocks, as long as it is held down. (Optionally, plays back in reverse through this.) Normal playback continues when the button is released. If not in playback mode, either action initiates playback mode as soon as the button is released. |
| Move Forward (FIG. 8) | If held and released quickly: Moves the cursor to the beginning of the next block to the right. If the cursor is on the rightmost block, this has the same effect as pressing Stop. If held down: Plays fast-forward through the current block and succeeding blocks as long as the button is held down. Playback at normal speed continues when the button is released. |
| Stop | Stops playback and resumes continuous recording (i.e., default mode). The cursor disappears. |
| Capture (FIG. 9) | Toggles the capture state of the current block (as indicated by the visible cursor). May be pressed at any time to capture the current block. A second press releases the current block from capture. In default mode, captures the most recent block(s). (See below for details of default mode behavior.) |
| Capture All | When pressed, all blocks acquired thereafter are marked for capture; when pressed a second time, restores normal mode in which blocks acquired thereafter are not marked for capture. In either mode, the Capture control may be used to toggle the capture state of any particular block, including the one currently being acquired. |
| Split (FIG. 10) | Divides the current block into two blocks. The division is made at the last silence before the current cursor position that exceeds a certain minimum duration (the split duration threshold) before the button is pressed. A second press undoes the division, if no other button has been pressed after the Split button (or if a sufficient time has elapsed from pressing the Split button). |

Figure 6A:
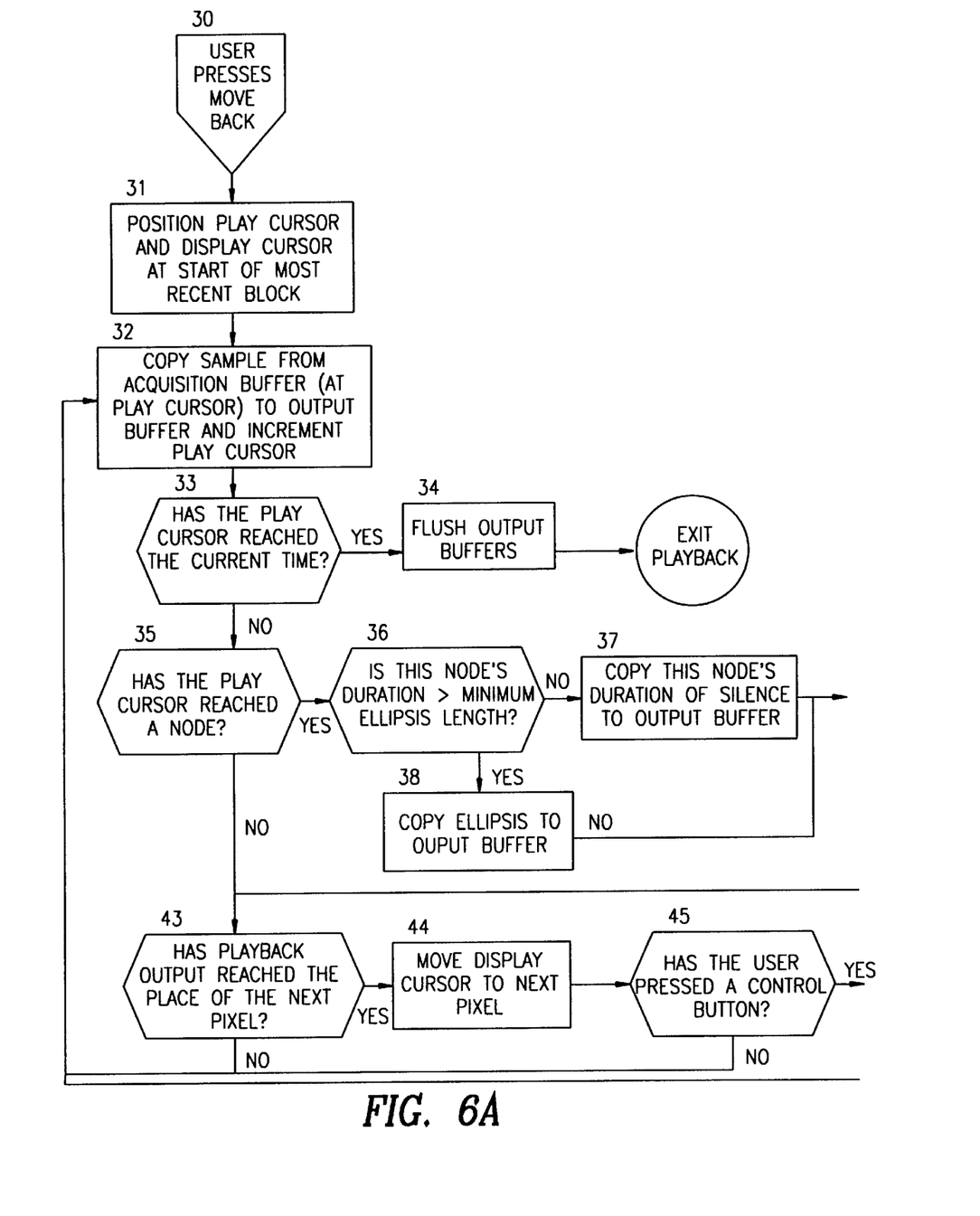
FIG. 6 is a flowchart of the process of playing back acquired material in response to a user's request.
Figure 6B:
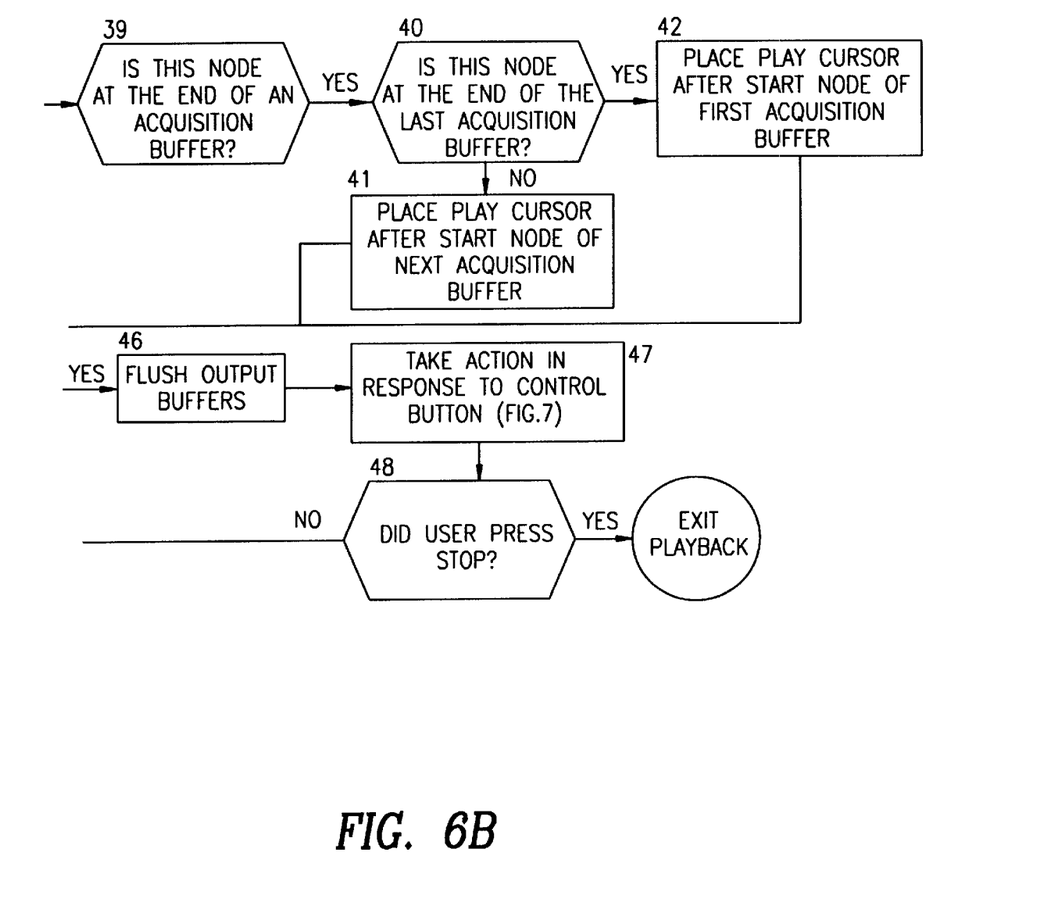

The behaviors described above apply to playback mode, which is entered by pressing or holding down the Move Back button, then releasing it. While in playback mode, the system continuously plays back material in the acquisition buffers, in a forward direction at the same speed as recorded, as long as no keys are being pressed or held down. The playback process is illustrated in FIG. 6.

The default mode of the device goes into effect on startup, and is reverted to from playback mode either on pressing the Stop button or when playback reaches the current time (or, if the implementation is capable of simultaneous recording and playback, after the controls have not been manipulated for a certain interval of time). In default mode, no cursor is shown on the display; pressing the capture button captures the most recent block. (Alternatively, pressing Capture once may capture the most recent minute, pressing it twice in rapid succession may capture the most recent two minutes, and so on. These intervals may be adjusted to the nearest block boundary.) If this most recent block continues through the time the capture button is pressed—i.e., if less time than the block separation threshold of detected silence had elapsed before the capture button was pressed-the device continues to capture data until either the capture button is pressed again or a sufficient pause has been detected. (The device may sound an audible warning at that point, giving the user a choice whether to continue capturing.)

In some implementations (e.g., on personal computer systems employing two sound cards), the acquisition of current audio data through the input buffers into the acquisition buffers continues through the user's manipulation of the controls and during playback. In other implementations, the continuous recording is suspended while in playback mode. Specifically, a typical single sound card on a personal computer cannot record and play back simultaneously.

Data Elements

The data representing intervals of sound and silence are identified by the times of their occurrence and the Places where they are stored in the acquisition buffers. Times are identified by unsigned long integers representing the number of sample intervals (or "ticks") that have elapsed in the course of the continuous recording process. In working with these quantities, consideration must be made for the possibility of the maximum possible long integer value being reached and "wrapping around" to zero; this may be handled by an appropriate overloading of operators and functions, taking the current value of origin time into account.

Places in the acquisition buffers are represented by structures containing the following data:

| tTime | Number of sample intervals elapsed up to this point in the continuous recording process. |
| --- | --- |
| pAcqbuff | Pointer to the acquisition buffer record for the acquisition buffer containing this Place. |
| pWhere | Pointer to the current place in the acquisition buffer. If in a silence node, this points to the beginning of the node. |
| tTixTillNode | Number of samples (going forward) before the next node; 0 if in a node. |
| tNodeTix | Number of sample intervals elapsed within the current silence node; 0 if not in a node, so count begins with 1 and ends with the node's tDuration. |

Places constitute the base class for a number of logical cursors, for the various functions of recording, playing back and storing sampled audio data, as they allow random access to any point in the acquisition buffers. For the same reason, places are also incorporated in the data underlying the user interface, where they allow for easy translation between the display elements and the corresponding places in the user interface graphs.

Implementation

The data underlying the user interface are implemented in the form of a circular, expandable array of pixel records each containing sufficient data to support one linear element of the time scale, the amplitude graph, and the block graph. Each pixel record contains the following data:

| nBlocking | An anumerator indicating the status of this element in the block graph. Possible values are: SPACE (indicating an interval, or part of an interval, of silence), BLOCK (indicating an interval, or part of an interval, of sound), and CAPTURED_BLOCK (indicating an interval, or part of an interval, of sound that has been marked by the user for permanent storage). |
| --- | --- |
| sAmplitude | A sample value representing the amplitude to be shown for this element in the amplitude graph. |
| plWhere | A Place record corresponding to the beginning of the corresponding interval in the acquistion buffers. At the beginning of a contigous sequence of BLOCK, SPACE, or CAPTURED_BLOCK pixels, this is the location at which the actual interval of silence or sound begins in the acquistion buffers: it points to a node (for SPACE) or points to data immediately following a node (for BLOCK or CAPTURED_BLOCK). |

Figure 5:
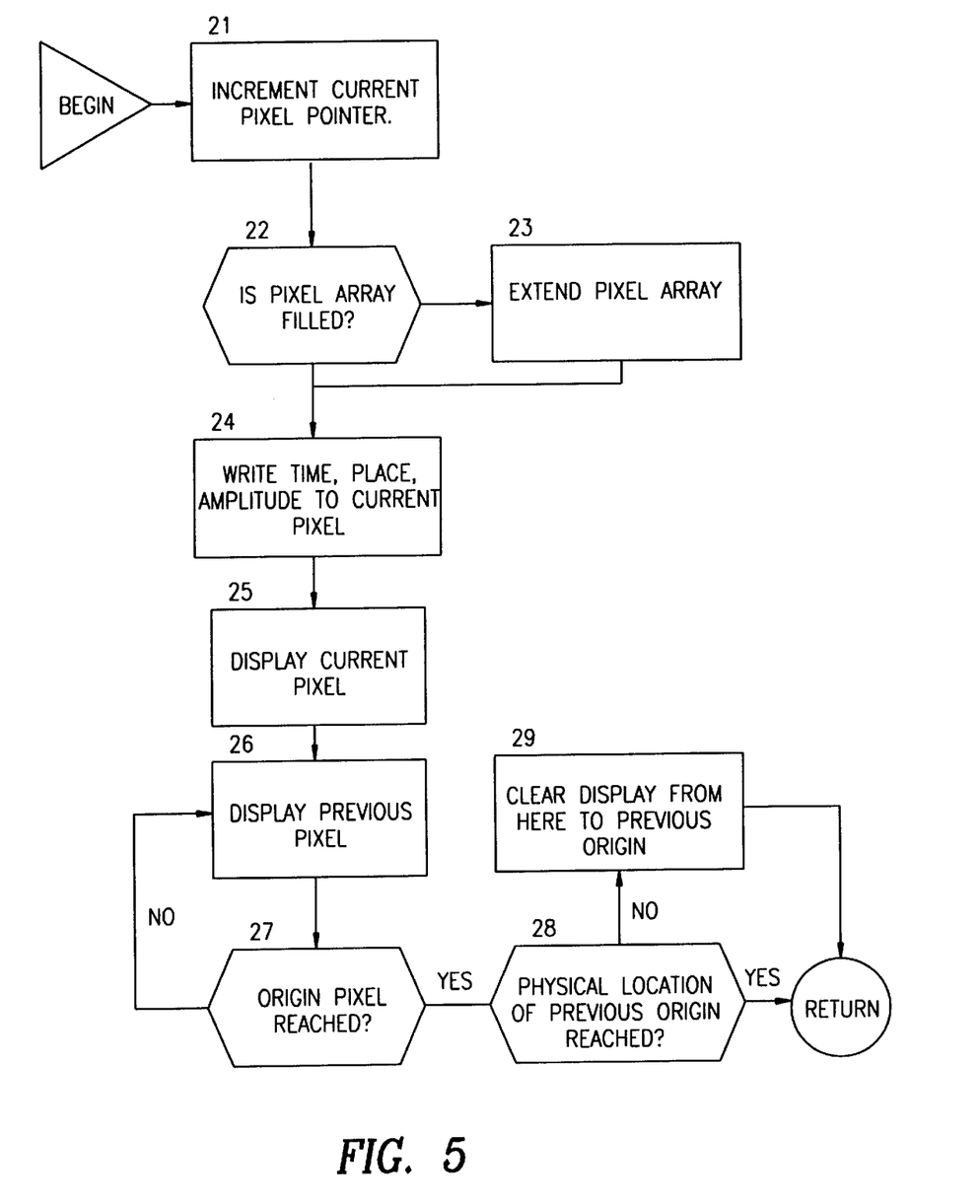
FIG. 5 is a flowchart of the periodic process of updating the display as audio data are acquired.

FIG. 5 illustrates the display update function, which writes new pixel records and is called at regular intervals in the continuous recording process, corresponding to the duration of one pixel record. Its arguments include the data for the pixel record it writes: the current time and Place in the acquisition buffer and the relevant (maximum or average) amplitude value; this value is reset in preparation for the next pixel interval. The display is updated to show the new pixel, in all three graphs, at the right edge of the display (representing the present time), shifting all previous pixels to the left (blocks 26–27). To facilitate this shifting in the display, a pointer to the current pixel (representing the current time) is incremented with each new pixel written (block 21).

Each new pixel record in turn is written at the location in the pixel array immediately following the last written pixel element. When the end of the pixel element array has been reached, the next pixel element is written at the beginning of the pixel array, provided that the existing pixel element at that location does not represent data remaining in the acquisition buffers. If the existing pixel record does represent still-valid data (block 22), then the pixel array is expanded (as by reallocating memory at a different location).

The time scale is constructed from time values contained in the plWhere members of each pixel record, which will not necessarily form a linear progression of times: Not only are the Places contained in pixel records adjusted on block boundaries, but there may also be breaks representing long intervals of silence, or places where an extra pixel was added to produce a visible blank space in the block graph for an otherwise insufficiently long interval of silence. The time scale is appropriately marked to reflect these possible irregularities.

Any interval of silence exceeding a predetermined length (the minimum ellipsis length) is represented by an "ellipsis" or break in the display, shorter than the corresponding actual number of pixels. When such an interval is encountered in playback, a short "ellipsis" waveform representing the break is played instead of playing through the entire duration of the silence.

Playback is achieved by means of a scheme analogous (in reverse) to the recording scheme: The Place represented by the current pixel record (as indicated by the current cursor position) is found in the acquisition buffer, and the audio data following it is transcribed to a queue of output buffers allocated by the application program. In the transcription process, audio data are transcribed identically and silence nodes are expanded to their full durations; the intervals stored as silence nodes may be filled with zero-amplitude values or with a dithering waveform containing values differing from zero by no more than the amplitude threshold (FIG. 6, block 37). Output buffers are sent, in the order transcribed, to a waveform output device, which in turn routes their contents (via direct memory access (DMA)) through a digital-analog converter to the audio output. Concurrently with this playback process, audio data continue to be transcribed from the acquisition buffers into another output buffer or buffers, each of which in turn generates a further interrupt or message when it has finished playing back. When this occurs, the output buffer is assigned to the tail end of the queue awaiting transcription from the acquisition buffers. (By keeping track of the corresponding Places in the acquisition buffers and the display data, the cursor may be appropriately advanced on receiving this message or signal.)

A minimum of two output buffers, used alternately, is required. Particularly in multitasking systems, there may be times when no output buffers are available for transcription because all allocated output buffers are still awaiting playback; when this occurs, new output buffers may be allocated. The memory allocated for these buffers may be freed when no longer needed, or when the number of allocated but untranscribed buffers exceeds a certain number.

When any key that moves or activates the cursor is pressed, playback must be interrupted. This involves forcing the return of any partially played output buffer and removing any remaining output buffers from both the queue awaiting playback and the queue awaiting transcription from the acquisition buffers (FIG. 6, block 46). Responses to various user control actions are flowcharted in FIGS. 7–10.

In implementations that are not capable of concurrent recording and playback, recording must be terminated in the same instantaneous manner when any key that moves or activates the cursor is pressed. This involves forcing the return of any partially recorded input buffer (noting the actual quantity of recorded data therein) and removing any remaining input buffers from both the queue awaiting recording and the queue awaiting transcription into the acquisition buffers.

In implementations capable of concurrent recording and playback, processing time must be appropriately apportioned (by means of program threads or otherwise) to the queue of input buffers awaiting transcription to the acquisition buffers and the queue of output buffers awaiting transcription from the acquisition buffers, when both processes are actually occurring at the same time. That is, processing time should be apportioned to minimize the number of buffers in the input queue while ensuring that there will be a certain minimum number of buffers in the output queue.

Although the present invention has been described in connection with particular applications thereof, it is to be understood that additional embodiments, applications, and modifications, which will be obvious to those skilled in the art, included in the spirit and scope of the invention.

In the following claims:

The term "events" includes, without limitation, any auditory or visual events, data or signals, still or moving pictures, machine events, states or signals, and the states, signals or sounds of any musical instrument, any of the foregoing being of a discrete or a continuous nature.

The term "recording medium" or "medium" refers to any material or apparatus, whether now existing or hereafter invented, that is capable (whether alone or in combination with other components) of receiving impressions of events external to said material or apparatus, and of reproducing said impressions in combination with appropriate means. This term includes, but is not limited to, magnetic and optical media (tapes, disks, etc.) as well as all varieties of electronic memory, both volatile and non-volatile.

The term "acquired data" or "recorded data" or "data" refers to said impressions of external events on a recording medium.

The term "interval of silence" refers to any time interval of sufficiently low content or change (as determined by an apparatus or algorithm) as to be considered empty of any material worthy of recording.

While the preferred embodiment of the invention has been described in detail, modifications and adaptations may be made thereto, without departing from the spirit and scope of the invention, as delineated in the following claims:

I claim:

1. A process for selectively recording events, said process comprising the steps of:

providing an acquisition buffer comprising at least one finite extent of a recording medium;

providing a continuous acquisition means for recording events in said acquisition buffer;

recording with said acquisition leans in said acquisition buffer current events in place of earlier events, to insure that said acquisition buffer contains, at any given time, a record of the most recent events;

providing selection means enabling a user to select a portion or portions of said record of the most recent events recorded in said acquisition buffer, in order to determine which portion or portions, if any, of said record of events will be preserved; and preserving any portion or portions of said record of events selected by said user, said preserving step comprising at least one of the following steps:

reserving a portion of said record of events from being overwritten by other events; and transferring said selected portions of the record of events to a predetermined location.

2. The recording process of claim 1, further providing means for compressing said record of events, thereby conserving the quantity of recording medium occupied by said record of events.

3. The recording process of claim 1, further providing means for enabling a human user to select for preservation the record of all events that transpired between a selected past time and the time of said selection.

4. The recording process of claim 1, further providing means for enabling a human user to select for preservation the record of all events that transpired after a selected time, continuing until a future interval of silence of a predetermined minimum duration is reached.

5. The recording process of claim 1, further providing means for detecting intervals of silence in the course of said continuous acquisition, thereby conserving use of said recording medium.

6. The recording process of claim 1 wherein an interval of silence is recordedable as a number representing its length.

7. The recording process of claim 1, further providing means for displaying a representation of said record of events or any portion thereof.

8. The recording process of claim 1, further providing means for representing to a user the positions in time of said recorded events.

9. The recording process of claim 1, further providing means for reproducing said record of events.

10. The recording process of claim 1, further providing means for reproducing said record of events in reverse direction.

11. The recording process of claim 1, further providing means for presenting portions of said record of events for selection by a user.

12. The recording process of claim 1, further providing means for dividing said record of events into segments of recorded data which a user may select using said selection means.

13. The recording process of claim 12 wherein said segments are demarcated by detected intervals of silence.

14. The recording process of claim 12, further providing a visual display that represents said segments of recorded data.

15. The recording process of claim 12, further providing means for a user to select said segments of acquired data for permanent storage.

16. The recording process of claim 12, further providing means for a user to review or play back said segments of acquired data.

17. A process for selectively recalling events, comprising:

providing an acquisition buffer comprising at least one finite extent of a recording medium;

providing continuous acquisition means for recording events in said acquisition buffer;

recording with said acquisition means in said acquisition buffer current events in place of earlier events, to insure that said acquisition buffer contains, at any given time, a record of the most recent events;

providing selection means enabling a user to select a portion ox portions of said record of the most recent events recorded in said acquisition buffer, in order to determine which portion or portions, if any, of said record of events will be recalled or played back;

providing recall means for reproducing said record of events, and reproducing, using said recall means, any portion or portions of said record of events selected by said user using said selection means.

18. The process of claim 17, further providing means for compressing said record of events, thereby conserving the quantity of recording medium occupied by said record of events.

19. The recording process of claim 17, further providing means for detecting intervals of silence in the course of said continuous acquisition, thereby conserving use of said recording medium.

20. The process of claim 19 wherein an interval of silence is recorded as a number representing its length.

21. The process of claim 17, further providing means for displaying a representation of said record of events or any portion thereof.

22. The process of claim 17, further providing means for representing to a user the positions in time of said recorded events.

23. The process of claim 17, further providing means for a human user to review or play back a portion of said record of events in reverse direction.

24. The process of claim 17, further providing means for dividing said record of events into segments of recorded data which a human user may select using said selection means.

25. The process of claim 24 wherein said segments are demarcated by detected intervals of silence.

26. The process of claim 24, further providing a visual display that represents said segments of recorded data.

27. The process of claim 24, further providing means for selection by a user of said segments of recorded data for permanent preservation.

28. The process of claim 24, further providing means for a user to review or play back said segments of recorded data.

* * * * *